(12) United States Patent
Reykowski et al.

(10) Patent No.: US 9,720,060 B2
(45) Date of Patent: Aug. 1, 2017

(54) FET SWITCH AS DETUNE CIRCUIT FOR MRI RF COILS

(75) Inventors: Arne Reykowski, Newberry, FL (US); Rodney Housen, Gainesville, FL (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 783 days.

(21) Appl. No.: 14/118,345

(22) PCT Filed: May 22, 2012

(86) PCT No.: PCT/IB2012/052571
§ 371 (c)(1),
(2), (4) Date: Nov. 18, 2013

(87) PCT Pub. No.: WO2012/160518
PCT Pub. Date: Nov. 29, 2012

(65) Prior Publication Data
US 2014/0070808 A1    Mar. 13, 2014

Related U.S. Application Data

(60) Provisional application No. 61/488,861, filed on May 23, 2011.

(51) Int. Cl.
*G01V 3/00* (2006.01)
*G01R 33/36* (2006.01)
*G01R 33/3415* (2006.01)

(52) U.S. Cl.
CPC ..... *G01R 33/3628* (2013.01); *G01R 33/3657* (2013.01); *G01R 33/3415* (2013.01); *G01R 33/3664* (2013.01)

(58) Field of Classification Search
CPC ............ G01R 33/3628; G01R 33/3657; G01R 33/3415; G01R 33/3664
(Continued)

(56) References Cited

U.S. PATENT DOCUMENTS 4,459,498 A * 7/1984 Stengl .................. H03K 17/102
327/436
4,975,644 A * 12/1990 Fox ..................... G01R 33/3664
324/318

(Continued)

FOREIGN PATENT DOCUMENTS

DE    4422069 C1    9/1995
GB    2288024 A    10/1995
(Continued)

OTHER PUBLICATIONS

Gu et al., "Comparison of Si, GaAs, SiC and GaN FET-type Switches for Pulsed Power Applications", Jun. 2003, IEEE, Pulsed Power Conference, 2003, Digest of Technical Papers, PPC-2003. 14th IEEE International vol. 1, pp. 362-365.*
(Continued)

*Primary Examiner* — Susan Lee

(57) ABSTRACT

A radio frequency (RF) coil assembly for use in magnetic resonance includes a radio frequency coil (42, 100) and an electronic switch (28) which switches between open and closed states to detune and tune the coil to a preselected resonance frequency. Each electronic switch includes at least one field effect transistor (FET) (70) and a bias network (72).

20 Claims, 6 Drawing Sheets

(58) Field of Classification Search
USPC ........................................................ 324/309
See application file for complete search history.

(56) References Cited

U.S. PATENT DOCUMENTS

| | | | |
|---|---|---|---|
| 5,075,624 A | 12/1991 | Bezjak | |
| 5,103,195 A | 4/1992 | Dunsmore | |
| 5,414,340 A * | 5/1995 | Gannon | ................... G05F 1/563 323/266 |
| 5,578,961 A * | 11/1996 | Fajen | ..................... H03F 3/193 327/104 |
| 6,124,678 A * | 9/2000 | Bishop | ............... H05B 41/2822 315/209 PZ |
| 6,144,205 A | 11/2000 | Souza | |
| 6,157,094 A * | 12/2000 | Gamble | ................... H01F 6/005 307/113 |
| 6,263,229 B1 | 7/2001 | Atalar | |
| 6,452,394 B1 | 9/2002 | Lappalainen | |
| 7,782,059 B2 * | 8/2010 | DeVries | ............. G01R 33/3403 324/318 |
| 7,960,772 B2 | 6/2011 | Englekirk | |
| 2002/0180437 A1 | 12/2002 | Reykowski | |
| 2005/0073309 A1 * | 4/2005 | Williams | ........... G01R 33/3415 324/318 |
| 2006/0173284 A1 * | 8/2006 | Ackerman | ........... G01R 33/287 600/422 |
| 2007/0268018 A1 | 11/2007 | Wendt | |
| 2008/0231282 A1 | 9/2008 | Griswold | |
| 2008/0258731 A1 | 10/2008 | Smith | |
| 2009/0201019 A1 * | 8/2009 | Zhai | ................. G01R 33/34046 324/307 |
| 2010/0103709 A1 * | 4/2010 | Tofigh | ................... H02M 7/217 363/127 |
| 2011/0068792 A1 * | 3/2011 | Iannotti | .............. G01R 33/3415 324/318 |
| 2011/0074425 A1 * | 3/2011 | Chu | ................... G01R 33/3621 324/322 |

FOREIGN PATENT DOCUMENTS

| | | |
|---|---|---|
| JP | 0823270 A | 1/1996 |
| JP | 08229022 A | 9/1996 |
| JP | 08252237 A | 10/1996 |
| JP | 2001178702 A | 7/2001 |
| JP | 2004242475 A | 8/2004 |
| JP | 2007260079 A | 10/2007 |
| JP | 2009278836 A | 11/2009 |
| WO | 2010146487 A1 | 12/2010 |

OTHER PUBLICATIONS

Boutros et al., "GaN Switching Devices for High-Frequency, KW Power Conversion", Jun. 2006, IEEE, 2006 IEEE International Symposium on Power Semiconductor Devices and IC's, pp. 1-4.*

* cited by examiner

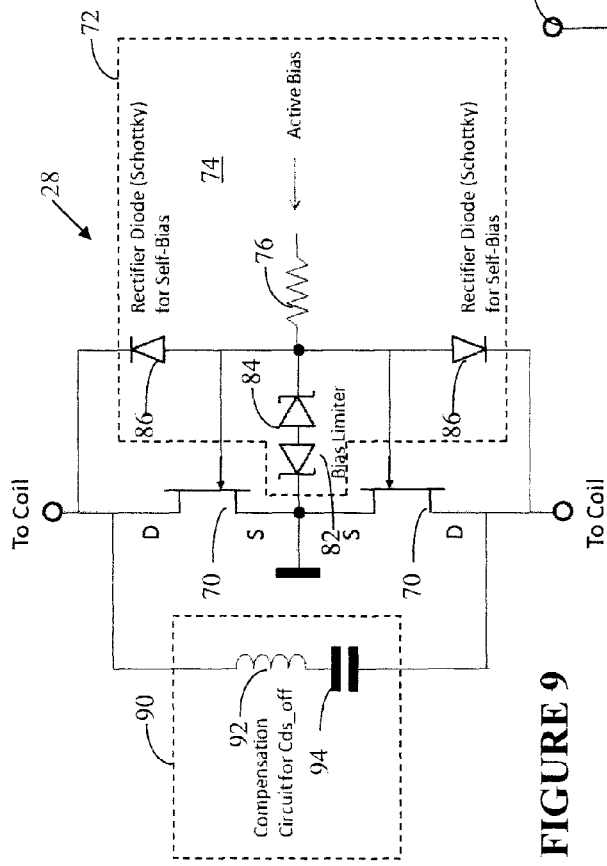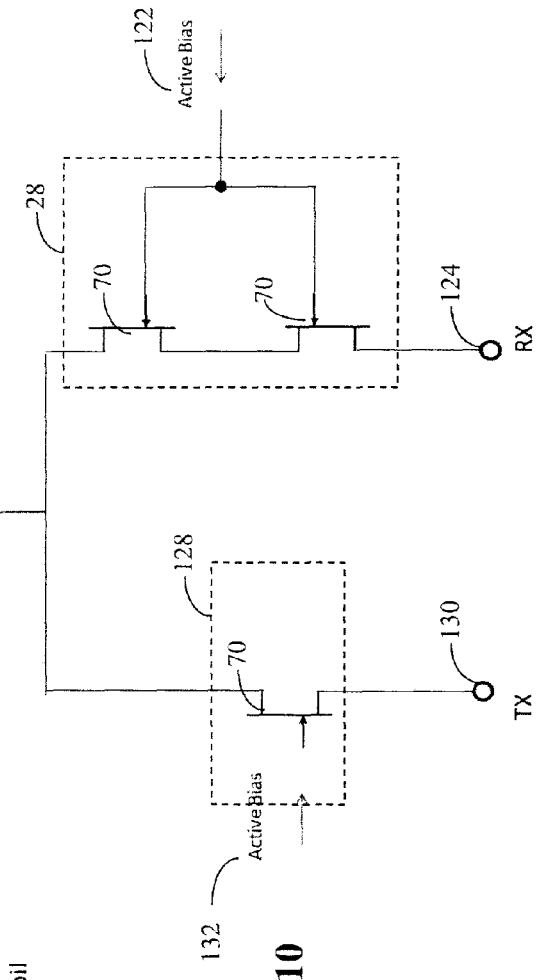
FIGURE 9
FIGURE 10

FET SWITCH AS DETUNE CIRCUIT FOR MRI RF COILS

CROSS-REFERENCE TO PRIOR APPLICATIONS

This application is the U.S. National Phase application under 35 U.S.C. §371 of International Application No. PCT/IB2012/052571, filed on May 22, 2012, which claims the benefit of U.S. Provisional Patent Application No. 61/488,861, filed on May 23, 2011. These applications are hereby incorporated by reference herein.

The present application relates to the medical arts, magnetic resonance arts, and related arts. The present application finds particular application in a circuit arrangement including an electronic switch to detune a magnetic resonance (MR) receive coil in an magnetic resonance imaging (MRI) or a magnetic resonance spectroscopy (MRS) system.

MR devices apply a main magnetic field through an examination region during the examination and/or treatment of patients. This strong field, typically denoted $B_0$, acts to align the nuclear spins of the body tissue within a patient to be examined. In some MR devices, the $B_0$ field is horizontally oriented, and in others it is vertically oriented.

In both horizontally and vertically oriented systems, magnetic resonance is excited in the aligned nuclear spins by a relatively strong orthogonal radio frequency (RF) field, typically denoted $B_1$. The $B_1$ field causes the aligned nuclear spins to tip into a plane orthogonal to the static magnetic field $B_0$. The spins precess back into alignment with the $B_0$ field emitting relatively weak RF magnetic resonance signals as the nuclear spins relax. This resonance is detected by RF coils tuned to the specific resonance frequency. These resonance signals are passed to processing equipment to reconstruct the signals into an image representation or derive spectroscopy information. Typically, the transmitted RF magnetic excitation signals are orders of magnitude larger than the received magnetic resonance signals generated by the relaxing nuclear spins detected by the RF receive coils.

To maintain patient safety and to protect the sensitive receiver equipment, the receive coils are typically decoupled or detuned during the transmit phase of the MR procedure. To minimize the above-mentioned problems, the coils contain a specific detuning circuit, whose function is to keep the receiver equipment from receiving the transmitted RF excitation signals. Accordingly, it is known to decouple MRI coils using PIN diodes in the detune circuit.

Current detune circuits for MR receive coils use PIN diodes to switch between the receive coils between tuned and detuned states. PIN diodes are semiconductor devices that can be operated as a DC current/voltage controlled RF switch. When forward biased with a DC current, the PIN diode acts like a closed switch with low on-resistance. When reverse biased with a DC voltage, the PIN diode acts like an open switch with high off-resistance and low parasitic capacitance. Since the forward bias uses a DC current, forward biasing requires a non-negligible amount of power.

In MRI receive coils, the PIN diode is used in a resonant tank circuit configuration, so that the MRI receive coil is detuned whenever the PIN diode is forward bias, i.e. the RF switch is "on". This configuration is preferred for MRI receive coils because the DC drive signals can be kept low. In addition, the tank circuit configuration also permits generation of part of the forward DC bias current from the RF excitation currents through the diode. If on the other hand the PIN diode is placed directly into the antenna structure, the diode is reverse biased during transmit. The reverse bias DC voltage has to exceed the RF voltage, which could be in the order of several hundred volts. Such a configuration also requires a relative high forward DC current (~100 mA) during receive in order to keep the losses low.

There are several disadvantages in utilizing PIN diodes in detune circuits. The PIN diodes need to be forward biased with 5 mW-100 mW of DC power. This power needs to be transported into the MRI coil and is eventually dissipated in the vicinity of the patient. While this does not appear to be a significant amount of power, one must take into account that modern MRI systems have receive coil arrays with more than 32 channels and the trend is still for higher numbers of channels. Also, in order to enable energy harvesting technologies, the power requirements need to be kept as low as possible. Another problem is that the resonant tank circuits used for the receive coils need careful tuning and testing which adds to the cost. The inductors required for the tank circuit also take up significant space and prohibit a fully self contained integrated solution. The resonant circuits can also potentially couple with other circuits and the transmit antenna and can also cause unwanted local distortions in the transmit field. Finally, the resonant tank circuits tend to heat up during the transmit phase which could be dissipated in the vicinity of the patient.

The present application provides a new and improved circuit arrangement including an electronic switch to detune a magnetic resonance imaging (MRI) coil in an MRI system which overcomes the above-referenced problems and others.

In accordance with one aspect, a radio frequency (RF) coil assembly for use in magnetic resonance is provided. The RF coil assembly includes a radio frequency coil and an electronic switch which switches between open and closed states to detune and tune the coil to a preselected resonance frequency. Each electronic switch includes at least one field effect transistor (FET) and a bias network.

In accordance with another aspect, a magnetic resonance method is provided. The magnetic resonance method includes transmitting RF excitation signals at a magnetic resonance (MR) frequency to induce resonance signals in an examination region and with at least one field effect transistor (FET) and a bias network, tuning an RF receive coil to the MR frequency to receive resonance signals from the examination region and detuning the RF receive coil to inhibit the RF receive coil from receiving the transmitted RF excitation signal.

One advantage resides in increased patient and equipment safety.

Another advantage resides in reduced system complexity.

Another advantage resides in reduced cost.

Another advantage resides in lower power consumption.

Another advantage resides in efficient utilization of space.

Still further advantages of the present invention will be appreciated to those of ordinary skill in the art upon reading and understanding the following detailed description.

The invention may take form in various components and arrangements of components, and in various steps and arrangements of steps. The drawings are only for purposes of illustrating the preferred embodiments and are not to be construed as limiting the invention.

FIG. 9 is a schematic diagram of another embodiment of the electronic switch and biasing network with the FETs in a source-source configuration in accordance with the present application.

FIG. 10 is a schematic diagram of a transmit/receive switch including the electronic switch in accordance with the present application.

Figure 1:
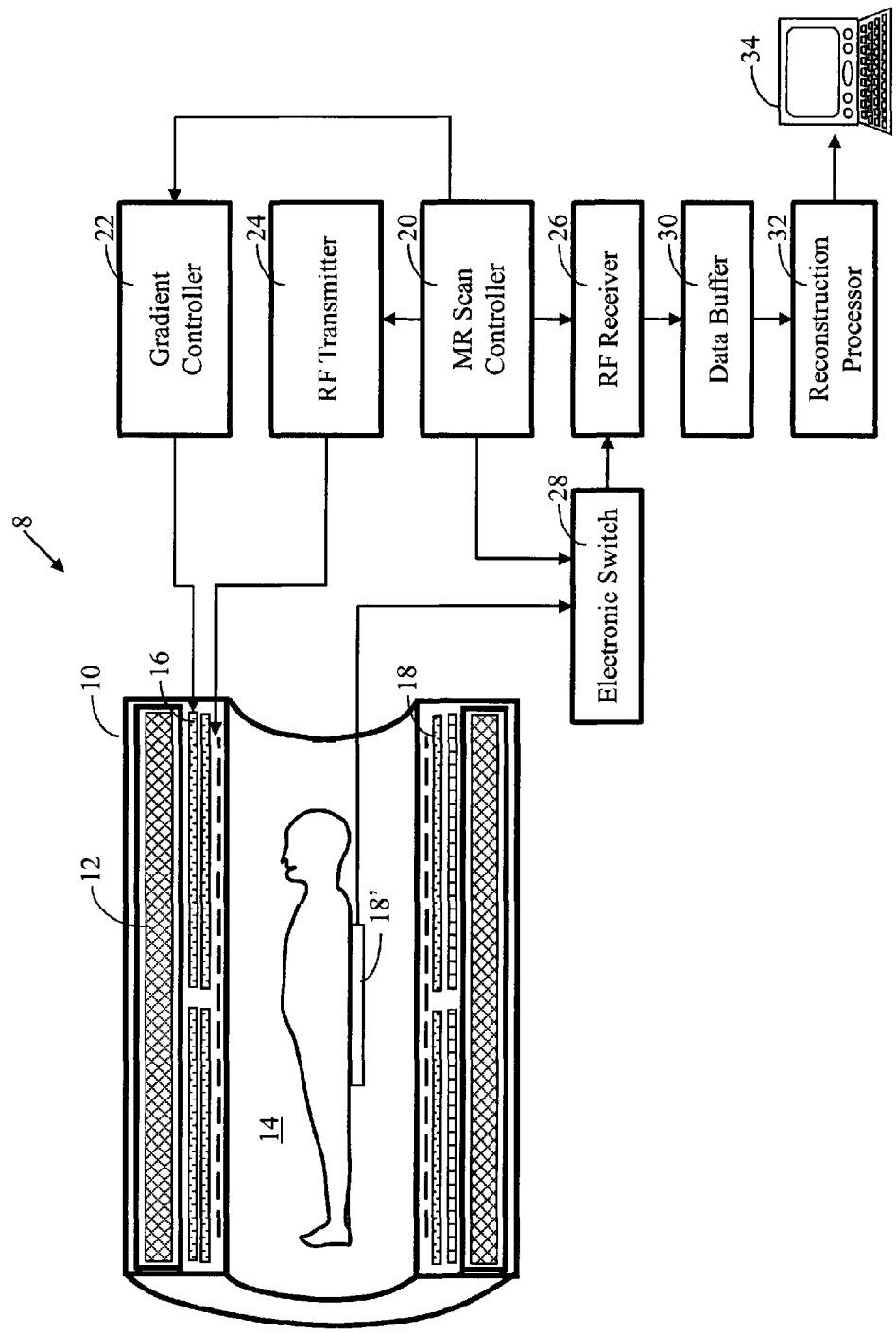
FIG. 1 is a diagrammatic illustration of a magnetic resonance imaging system in accordance with the present application.

FIG. 1 illustrates a magnetic resonance (MR) system 8 including an electronic switch to detune and tune a MR receive coil in accordance with various embodiments described herein. The electronic switch replaces current detune circuits for MRI coils which use PIN diodes to switch between the tuned and detuned state. The electronic switch has a low on-resistivity, e.g. 0.3 ohms, and a high blocking resistivity, e.g. greater than 3,000 ohms. In addition, the electronic switch is able to withstand a high voltage, e.g. greater than 100 volts, in the off or detuned state. The electronic switch also enables switching between the tuned and detuned states to be performed in less than 50 microseconds. The electronic switch is fabricated using Silicon-Carbide (SiC), Gallium-Nitride (GaN), and the like technologies which achieve the above-mentioned properties. In another embodiment, the electronic switch includes an isolated control gate which allows the switching between the tuned and detuned states to be done without any power. For example, a self-biasing network is included in the electronic switch to ensure proper detuning of the MR receive coil in the absence of an active detune signal or when coil is not properly connected to a MRI scanner.

With reference to FIG. 1, a MR scanner 10 includes a main magnet 12 which generates a temporally uniform $B_0$ field through an examination region 14. The main magnet 12 can be an annular or bore-type magnet, a C-shaped open magnet, other designs of open magnets, or the like. Gradient magnetic field coils 16 disposed adjacent the main magnet serve to generate magnetic field gradients along selected axes relative to the $B_0$ magnetic field for spatially or otherwise encoding the induced magnetic resonance signals, for producing magnetization-spoiling field gradients, or the like. The magnetic field gradient coil 16 may include coil segments configured to produce magnetic field gradients in three orthogonal directions, typically longitudinal or z, transverse or x, and vertical or y directions.

A radio-frequency (RF) excitation coil assembly 18, such as a whole-body radio frequency coil, is disposed adjacent the examination region 14. The RF coil assembly 18 generates radio frequency pulses for exciting magnetic resonance in dipoles of the subject. The radio frequency coil receive assembly 18 can also serve to detect magnetic resonance signals emanating from the examination region 14. A local, surface, or in-vivo RF receive coils 18' are provided in addition to the whole-body RF coil 18 for more sensitive, localized spatial reception of magnetic resonance signals.

To acquire magnetic resonance data of a subject, the subject is placed inside the examination region 14, preferably at or near an isocenter of the main magnetic field. A scan controller 20 controls a gradient controller 22 which causes the gradient coils 16 to apply the selected magnetic field gradient pulses across the examination region 14, as may be appropriate to a selected magnetic resonance imaging or spectroscopy sequence. The scan controller 20 also controls an RF transmitter 24 which is connected to the RF transmit coil assembly 18 to generate magnetic resonance excitation and manipulation $B_1$ pulses. The scan controller 20 also controls an RF receiver 26 which is connected to the RF receive coil assembly 18' to receive the generated magnetic resonance signals therefrom. The scan controller 20 also activates or controls an electronic switch 28 to detune and tune the MR receive coils as explained in greater detail below. Specifically, the electronic switch 28 replaces current detune circuits for MR receive coils to switch between a tuned and detuned state.

The received data from the RF receiver 26 is temporarily stored in a data buffer 30 and processed by a magnetic resonance data processor 32. The magnetic resonance data processor 32 can perform various functions as are known in the art, including image reconstruction (MRI), magnetic resonance spectroscopy (MRS), catheter or interventional instrument localization, and the like. Reconstructed magnetic resonance images, spectroscopy readouts, interventional instrument location information, and other processed MR data are stored in memory, such as a medical facility's patient archive. A graphic user interface 34 includes a user input device which a clinician can use for controlling the scan controller 20 to select scanning sequences and protocols, display MR data, and the like and a display device which displays reconstructed images and other readouts.

The RF transmit coil assembly 18 includes one or more dedicated transmit coils, each connected to the RF transmitter 24 respectively. In embodiments with a plurality of transmit coil elements, the RF transmitter 24 includes multiple channels, each connected to at least one transmit coil, which collectively generates the resonance excitation and manipulation $B_1$ pulses in the transmit coils. In embodiments with a plurality of receive coil elements, the RF receiver 26 includes multiple channels, each connected to at one or more receive coils, which receive the generated magnetic resonance signals. It should be appreciated that in a multi coil embodiment, different groups of coils can be used to excite resonance while the remaining coils are used to receive the resonance signals. Ideally, the transmit coils and receive coils should be completely isolated. During the excitation phase, currents tend to be induced in the receive coils which are constructed for receiving the induced resonance signals which are the same frequency as the excitation RF pulses. Induced currents as the resonance frequency in the receive coils, in turn, generate RF fields as the resonance frequency that oppose the transmitted excitation and manipulation $B_1$ pulses locally near the receive coils. Furthermore, the induced currents can not only damage sensitive receive coils and the receivers but also pose a threat to the subject's safety.

Figure 2:
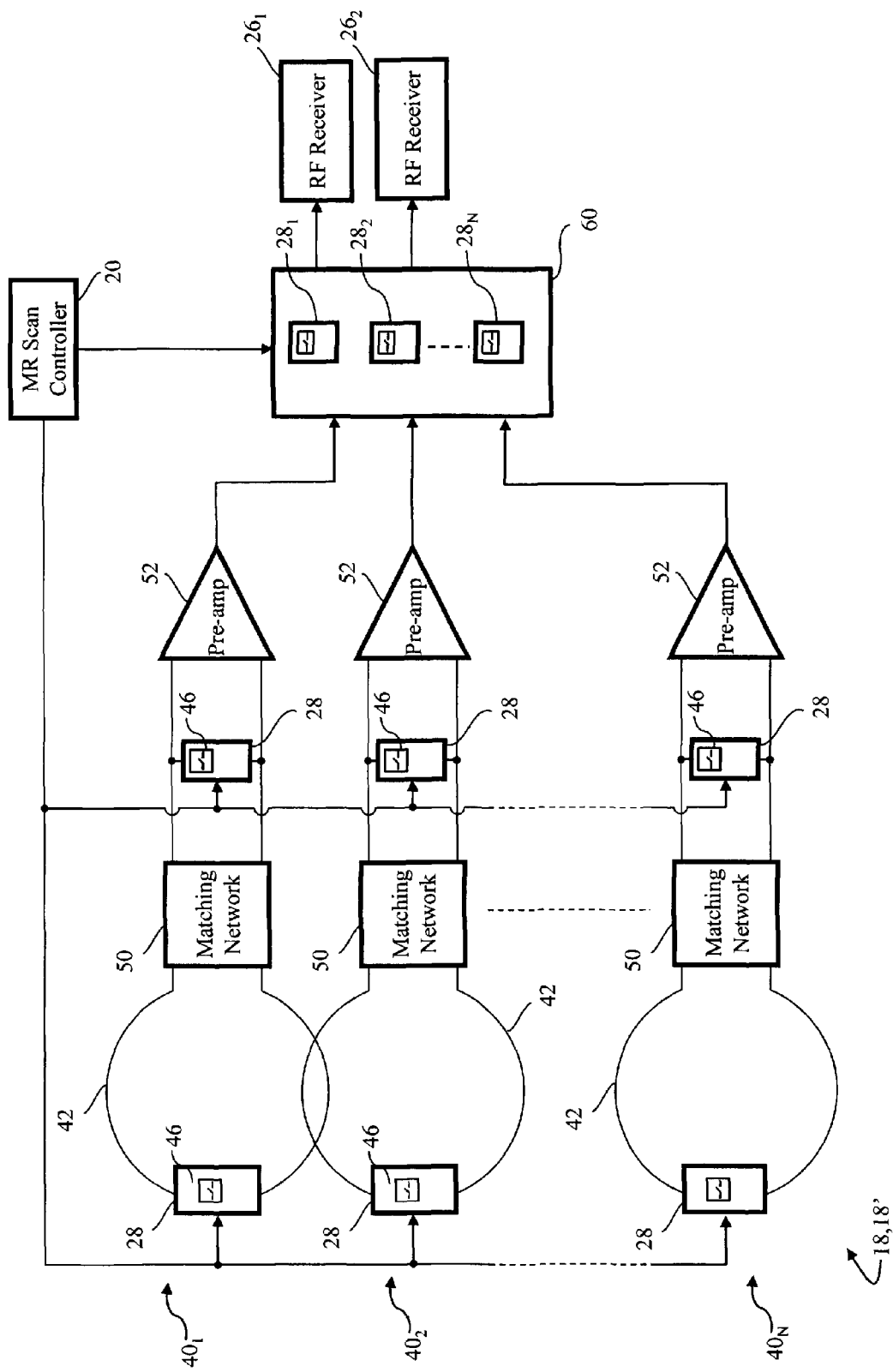
FIG. 2 is a diagrammatic illustration of a receive coil system in accordance with the present application.

With reference to FIG. 2, the RF receive coil assembly 18' includes a plurality of receive coils $40_1, 40_2, \ldots, 40_N$ which are diagrammatically illustrated. Each receive coil includes a coil segment 42 e.g. a loop coil, that is tuned to the resonance frequency and that is serially connected to an electronic switch 28. The electronic switch 28 opens during the transmit or excitation phase of the imaging procedure detuning the coil segment. The electronic switch 28 includes a field effect transistor (FET) 46 connected in series with the coil segment. The electronic switch 28 switches between the tuned and detuned state according to a control signal from the scan controller 20. Traditional detuning circuits employ a PIN diode switch; however, PIN diodes require a continuous control signal which may cause field distortions along the control signal transmission line unless it is properly shielded. Accordingly, at higher power transmit RF excitation pulses an increasingly higher control signal to bias the PIN diode is required to ensure the coil segment remains decoupled.

As mentioned above, the electronic switch 28 includes a FET 46 with an insulated gate, in one embodiment. In one embodiment, the electronic switch 46 is "normally off", i.e. provides a high off-resistance in the absence of a control signal such that the coil is detuned in the absence of the control signal. In addition, a self bias signal can be generated by rectifying part of the incident RF excitation signal and applying it to the control gate of the FET. The electronic switch 28 also includes a bias limiter, e.g. Zener diode and the like, which also is applied to the control gate. If the parasitic capacitance of the electronic switch 28 during the off-state is not negligible, the electronic switch 28 can also include a compensation circuit which is added in parallel to the electronic switch. The reactance values of the compensation circuit are higher than the reactance value of an inductor of a resonant tank circuit. Therefore, the electronic switch 28 still has a higher bandwidth than current tank circuits and more reduced losses. It is also contemplated that in one embodiment an array of electronic switches is placed in series to improve the voltage rating of the electronic switch. In another embodiment, a set of electronic switches is placed in parallel in order to reduce the on-state resistance.

In another embodiment, the transmit pulse is used to induce the DC bias voltage to bias the electronic switch 28 in the absence of a control signal. This arrangement can be realized by adding a passive control circuit to the electronic switch 28. The passive control circuit generates the control signal from the RF excitation signal itself.

With continuing reference to FIG. 2, the receive coils $40_1$, $40_2$, ..., $40_N$ include matching networks 50 to match the characteristic impedance of a corresponding coil segment 42 to a single channel RF pre-amplifier 52. The matching network 50 can be an adjustable matching network which permits the adjusting the matching impedance to accommodate the size of the subject and therefore compensate for a varying quality factor Q, of the receive coil. For example, a larger patient or other examined object will lower the Q value resulting in an impedance mismatch, thus effecting image quality.

In one embodiment, an electronic switch 28 is connected in parallel between the coil segment 42 and the pre-amplifier 52. In response to the DC bias signal generated by the scan controller 20 prior to the transmit phase, the electronic switch 28 is biased into a conductive state which short circuits the input of the pre-amplifier 52. The electronic switch 28 acts to protect the pre-amplifier 52 and other downstream electronics from excessive RF currents induced during the transmit phase of the imaging sequence. Additionally, the electronic switch 28 also monitors the induced current. If a particular maximum power level is detected, the electronic circuit 28 generates its own control signal to bias the electronic switch 28 into a conductive state, thus short circuiting the input of the pre-amplifier.

In one embodiment, the output of the pre-amplifier 52 is connected to a multi-channel (or multiple single channel) multiplexer circuit 60, each channel of the multiplexer corresponding to an output of a receive coil $40_1$, $40_2$, ..., $40_N$. The multiplexer includes a plurality of electronic switches $28_1$, $28_2$, ..., $28_N$, each corresponding to a channel of the multiplexer and, in turn, a receive coil. A control signal, supplied by the scanner controller 20, biases one or a subset of the electronic switches 28 into a conductive state to couple one or more receive coils to downstream processing. In this manner, the receive coil can have more channels than the downstream processing circuitry, e.g. the RF receivers $26_1$, $26_2$.

The preceding describes a plurality of potential placements of the switch 28. It is contemplated that the switch(s) will be located in only one of the described placements. However, two or more placements are also contemplated.

Figure 3:
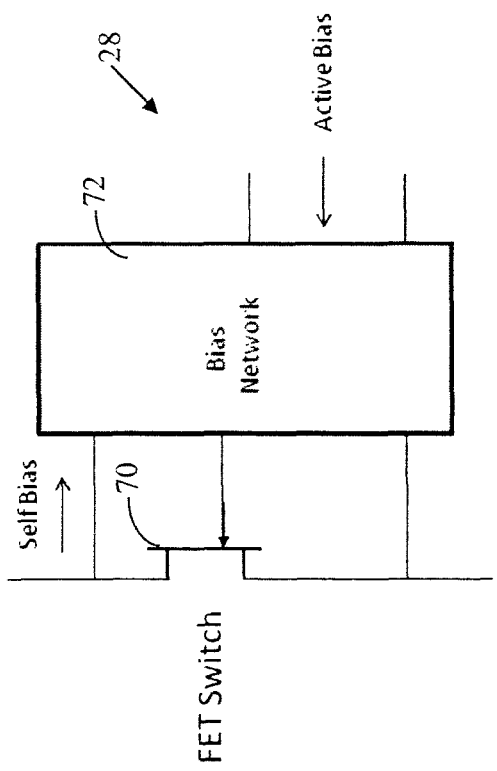
FIG. 3 is a schematic diagram of an electronic switch and a biasing network in accordance with the present application.

With reference to FIG. 3, the electronic switch 28 includes a field effect transistor (FET) 70 and a bias network 72. The FET 70 is provided for switching the electronic switch 28 between non-conductive and conductive state, hence the receive coil between the tuned and detuned states. As mentioned above, it would be preferable to have the FET 70 in a normally off-state. For example, the electronic switch is in the off-state to detune the MR coil and is in the on-state to tune the MRI coil to the MR frequency. It is also contemplated that the FET 70 be in a normally on-state. For example, the one or more electronic switches are connected between the receive coil elements and ground of the MR receive coil in the on-state and tune the MR coil in the open state. It is also preferable that the FET 70 have a low on-resistivity, e.g. 0.3 ohms or less, and a high blocking resistivity, e.g. greater than 3,000 ohms; is able to withstand a high voltage, e.g. greater than 100 volts, in the off or detuned state; and enables the switching between the tuned and detuned states to be performed in less than 50 microseconds. It is also preferable that the FET 70 be fabricated using Silicon-Carbide (SiC), Gallium-Nitride (GaN), and the like technologies which achieve the above-mentioned properties. The bias network 72 provides a bias voltage to the FET 70 to control the conductivity of a channel of one type of charge carrier in a FET 70. The bias network 72 may include a plurality of electrical components configured to provide, based on either an active bias or a self bias, a plurality of bias voltages. The bias voltages are then provided to an input of the FET 70.

In one embodiment, in response to the bias network 72 receiving an active bias signal generated by the scan controller 20, the FET 70 is switched into a conductive state to couple one or more receive coils to downstream processing. The FET 70 and bias network 72 have the characteristics that when provided a forward bias signal from the scan controller 20, the electronic switch 28 is switched into a conductive state or tuned state. When the FET 70 and bias network 72 are provided a reverse bias signal from the scan controller 20, the electronic switch 28 is switched to a non-conductive state or detuned state. Thus, when the electronic switch 28 is provided a reversed bias signal from the scan controller 20, the RF receiver 26 is disconnected.

In another embodiment, a transmit pulse is used to induce a bias voltage to generate a self bias signal to switch the electronic switch 28. The FET 70 and bias network 72 would have the same characteristics as mentioned above in response to the bias voltage. For example, the electronic switch and bias networks are switched to a conductive or tuned state when provided a forward bias generated from the transmit pulse and is switched to a non-conductive state or detuned state in the absence of the transmit pulse.

Figure 4:
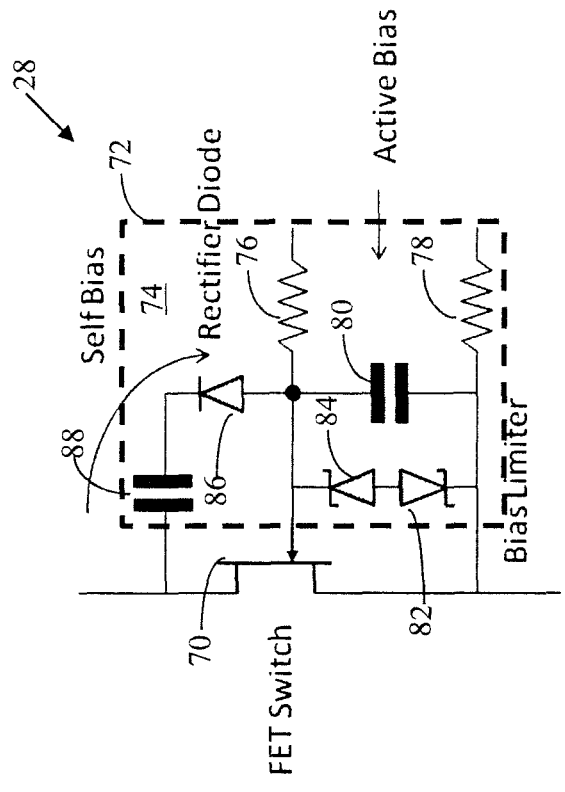
FIG. 4 is a schematic diagram of another embodiment of the electronic switch and biasing network including a bias limiter in accordance with the present application.

With reference to FIG. 4, a schematic diagram of one embodiment of the electronic switch 28 and the bias network 72 is illustrated. As mentioned above, the electronic switch 28 includes the FET 70 and a bias network 72. The bias network 72 includes a bias circuit 74 formed from a first resistor 76, second resistor 78, and a capacitor 80. The bias circuit 74 also includes a bias limiter 82 formed from two voltage limiting diodes 84, e.g. Zener diodes and the like. The bias limiter 82 limits the voltage of the active and self bias provided to the FET 70. The bias circuit 74 also includes a rectifier diode 86 and a second capacitor 88 to provide self bias in the absence of active bias. The rectifier diode 86 converts alternating current received from the transmit pulse to direct current. The direct current charges the capacitor with a DC voltage that controls the switching of the FET 70.

Figure 5:
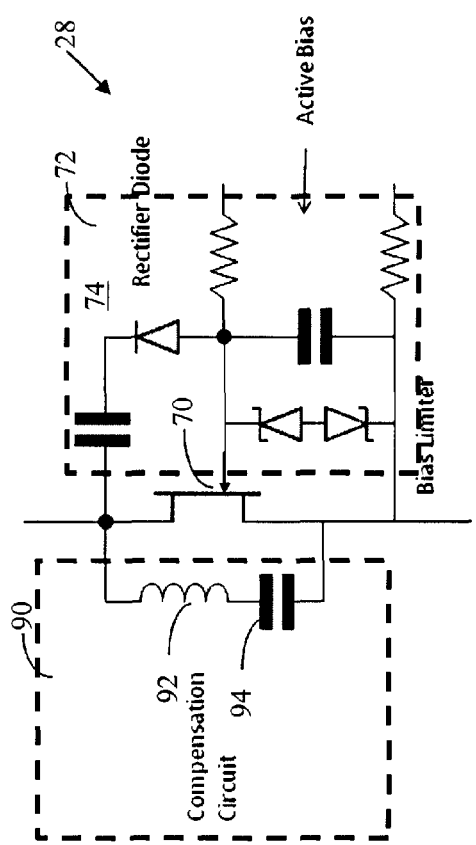
FIG. 5 is a schematic diagram of another embodiment of the electronic switch and biasing network including a compensation circuit in accordance with the present application.

With reference to FIG. 5, a schematic diagram illustrates another embodiment of the electronic switch 28 and biasing network 72 to which a compensation circuit 90 has been added. The electronic switch 28 includes the FET 70 and the bias network 72 with the same bias circuit 74 as described in FIG. 4. The electronic switch 28 also includes a compensation circuit 90 formed from a first inductor 92 and a third capacitor 94 in series. As illustrated, the compensation circuit 90 is in parallel with the FET 70. The compensation circuit 90 removes the parasitic capacitance which may be present during the non-conductive or tuned state. The combination of the first inductor 92 and the third capacitor 94 in the compensation circuit 90 removes the parasitic capacitance from the electronic switch 28 and also cuts the flow of any DC current through the open electronic switch 28. The reactance values of the compensation circuit 90 are higher than a reactance value of an inductor of a resonance tank, therefore the electronic switch 28 has a higher bandwidth than current resonant tank circuits and reduced losses.

Figure 6:
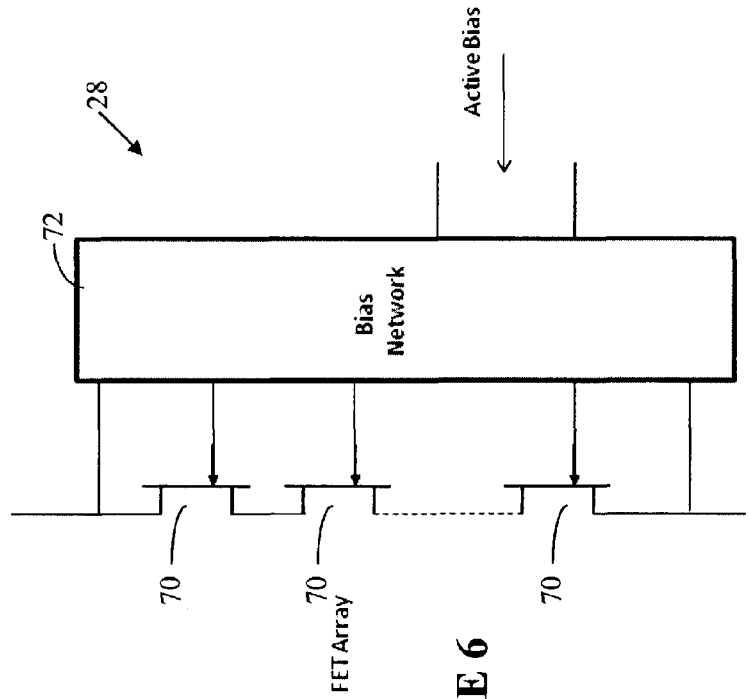
FIG. 6 is a schematic diagram of another embodiment of the electronic switch and biasing network including an array of FET switches in series in accordance with the present application.
Figure 7:
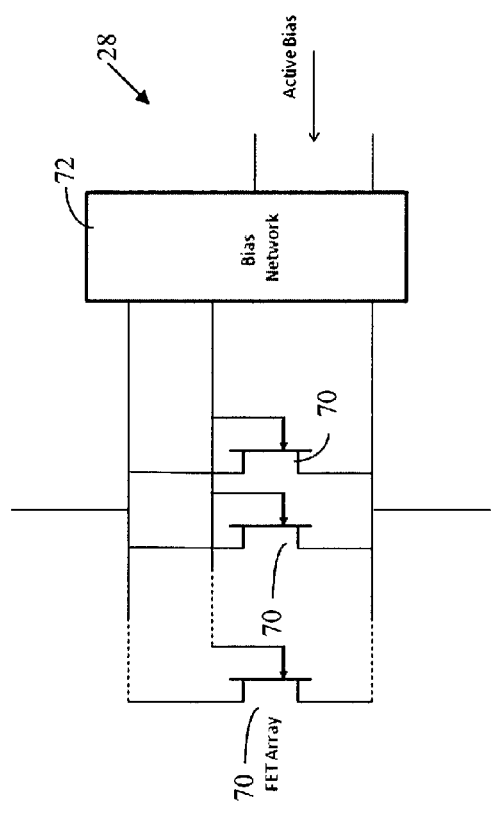
FIG. 7 is a schematic diagram of another embodiment of the electronic switch and biasing network including an array of FET switches in parallel in accordance with the present application.

With reference to FIGS. 6 and 7, schematic diagrams illustrate another embodiment of the electronic switch 28 and biasing network 72. As illustrated in FIG. 6, the electronic switch 28 includes the bias network 72 as described above and a plurality or the array of FETs 70 in series. A configuration including an array of FETs 70 in the series improves the voltage rating of the electronic switch 28. Likewise as illustrated in FIG. 7, the electronic switch 28 includes the bias network 72 and a plurality or the array of FETs 70 in parallel. A configuration including an array of FETs 70 in the parallel configuration reduces the on-state resistance of the electronic switch 28. It is contemplated that the electronic switch 28 may consist of an array of FETs 70 that are placed in series and in parallel in order to achieve both a high voltage rating and a low on-state resistance.

Figure 8:
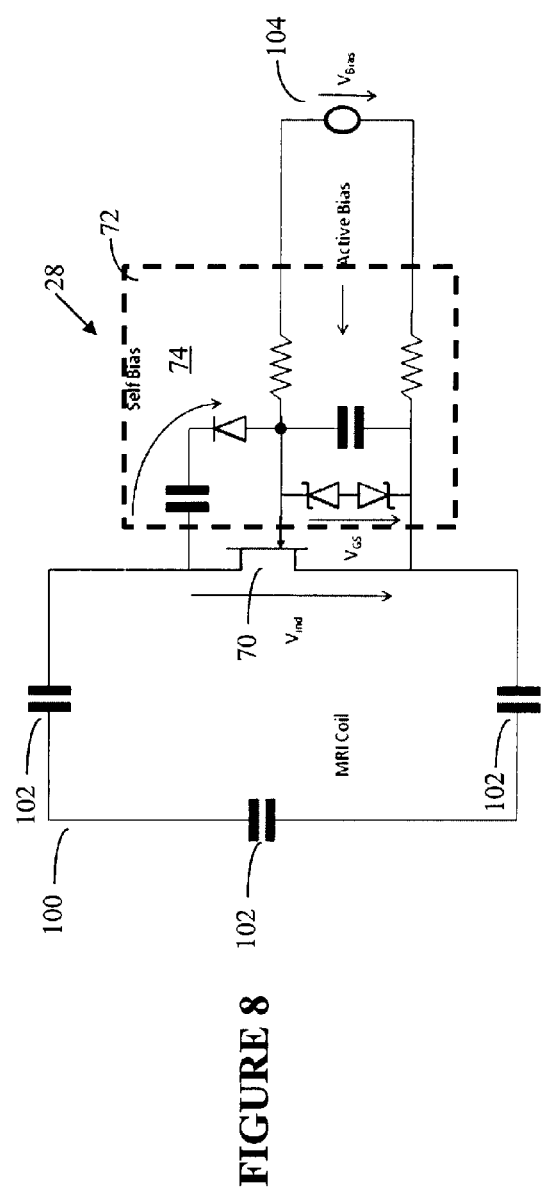
FIG. 8 is a schematic diagram of a complete MR receive coil with an electronic switch in accordance with the present application.

With reference to FIG. 8, a schematic diagram of a complete MR receive coil with an electronic switch 28 is illustrated. A MRI coil 100 includes a plurality of capacitors 102 which tune the coil to the MR frequency to detect magnetic resonance signals emanating from the examination region of an MRI scanner. The electronic switch 28 includes the FET 70 and the bias network 72 with the same bias circuit 74 as described in FIG. 4. A voltage source 104 provides an active bias voltage to the bias network 72 in order to bias the electronic switch 28 to the open state and to detune the coil to the MR frequency. Removing the bias potential 104 switches the FET 70 to its closed state tuning the coil.

With reference to FIG. 9, a schematic diagram illustrates another embodiment of the electronic switch 28 and biasing network 72 to which a compensation circuit 90 has been added. The electronic switch 28 includes a plurality or the array of FETs 70 in series. A configuration including an array of FETs 70 in the series improves the voltage rating of the electronic switch 28. The array of FETs 70 are in a source-source configuration. This configuration of the FETs in a source-source configuration reduces the voltage drop across each FET 70 and improve the "off" switch behavior. The bias network 72 includes a bias circuit 74. The bias circuit 74 also includes a bias limiter 82 formed from two voltage limiting diodes 84, e.g. Zener diodes and the like. The bias limiter 82 limits the voltage of the active and self bias provided to the FET 70. The bias circuit 74 also includes rectifier diodes 86 to provide self bias in the absence of active bias. The rectifier diodes 86 converts alternating current received from the transmit pulse to direct current. The direct current charges the capacitor.

With reference to FIG. 10, a schematic diagram illustrates of another embodiment of an electronic switch 28 in a transmit/receive switch 120. This would be preferred in a MRI scanner in which the same coil element is used for both receiving and transmitting. The electronic switch 28 includes a plurality or the array of FETs 70 in series. As mentioned above, it would be preferable to have the FET 70 in a normally off-state. For example, the electronic switch is in the off-state to detune the MR coil and is in the on-state to tune the MRI coil to the MR frequency. In response to the electronic switch 28 receiving a receiving active bias signal 122 generated by the scan controller 20, the FETs 70 is switched into a conductive state to couple the RF receiver 124 with the coil element 126. The transmit/receive switch also includes a transmitter electronic switch 128 to couple the RF transmitter 130 with the coil element 126. In response to the transmitter electronic switch 126 receiving a transmitting active bias signal 132 generated by the scan controller 20, the FET 70 is switched into a conductive state to couple the RF transmitter 130 with the coil element 126.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

Having thus described the preferred embodiments, the invention is now claimed to be:

1. A radio frequency (RF) receive coil assembly for use in magnetic resonance, including:
   a radio frequency receive coil; and
   an electronic switch which switches between open and closed states to detune and tune the coil to a preselected resonance frequency, each electronic switch including:
   at least one field effect transistor (FET) and a bias network,
   wherein each of the at least one FET has a gate, wherein the bias network is configured to provide a bias voltage to the gate of each of the at least one FET to switch the at least one FET from the closed state to the open state, wherein the bias network is configured to provide the bias voltage in response to a self bias signal, the bias network further being configured to provide the bias voltage in response to a control signal,
   wherein the RF coil is a loop coil and the at least one FET is connected in the loop to tune the loop coil to the MR frequency when the at least one FET is closed and to detune the loop coil when the at least one FET is open, and wherein the electronic switch further includes a self bias network configured to generate the self bias signal by rectifying part of an incident RF signal.

2. The RF coil assembly according to claim 1, wherein the bias network includes:
a biasing circuit which generates the control signal to switch the at least one FET from the closed state to the open state.

3. The RF coil assembly according to claim 2, wherein control signal is generated from at least one of an active bias signal or the self bias signal.

4. The RF coil assembly according to claim 1, wherein the electronic switch further includes:
a compensation circuit which removes parasitic capacitance from the electronic switch during the tuned state.

5. The RF coil assembly according to claim 1, wherein the electronic switch has a resistance of less than 0.3 ohms during the tuned state and a resistance greater than 3000 ohms during the detuned state.

6. The RF coil assembly according to claim 5, wherein the electronic switch withstands voltages of greater than 100 volts in the detuned state.

7. The RF coil assembly according to claim 6, wherein the electronic switch includes an array of FETs placed in series to improve a voltage rating of the electronic switch.

8. A magnetic resonance method including:
transmitting RF excitation signals at a magnetic resonance (MR) frequency to induce resonance signals in an examination region;
with the electronic switch according to claim 1, tuning an RF receive coil to the preselected resonance frequency to receive resonance signals from the examination region and detuning the RF receive coil to inhibit the RF receive coil from receiving the transmitted RF excitation signal;
generating a bias voltage to switch the electronic switch to a non-conductive state to detune the RF receive coil.

9. The method according to claim 8, wherein a switching time between the detuned and tuned state is less than 50 microseconds.

10. The method according to claim 9, wherein the at least one FET and the bias network withstand voltages of greater than 100 volts in the detuned state.

11. A radio frequency (RF) coil assembly for use in magnetic resonance, including:
a radio frequency receive coil; and
an electronic switch which switches between open and closed states to detune and tune the coil to a preselected resonance frequency, the electronic switch including:
an array of field effect transistors (FETs) connected in series to improve a voltage rating and reduce capacitance of the electronic switch,
a bias network configured to bias the array of FETs to an open state to detune the coil,
wherein the electronic switch has a switching time between the closed and open states of less than 50 microseconds,
wherein the electronic switch has a resistance of less than 0.3 ohms during the open state and a resistance greater than 3000 ohms during the closed state,
wherein the electronic switch withstands voltages of greater than 100 volts in the open state.

12. The RF coil assembly according to claim 11, wherein the RF coil is a loop coil and the array of FETs is connected in the loop to tune the loop coil to an MR frequency when the array of FETs is closed and to detune the loop coil when the array of FETs is open.

13. The RF coil assembly according to claim 11, wherein the bias network further includes:
a self bias network which generates a self bias signal by rectifying part of an incident RF signal.

14. The RF coil assembly according to claim 13, wherein the bias network further includes:
a bias limiter which limits a voltage of the self bias signal.

15. The RF coil assembly according to claim 11, wherein each FET of the FET array is fabricated from at least one of silicon-carbide FETs or gallium-nitride FETs.

16. The RF coil assembly according to claim 11, wherein a plurality of the series connected arrays of FETs are placed in parallel to reduce resistance of the electronic switch.

17. A magnetic resonance system, including:
a magnet which generates a static magnetic field in an examination region;
a RF transmitter and a RF transmit coil which generates RF pulses at a magnetic frequency to excite and manipulate resonance in the examination region;
at least one RF receive coil assembly according to claim 11 configured to acquire magnetic resonance data from the examination region;
at least one RF receiver connected to the at least one RF coil assembly;
a control circuit to generate a control signal to switch a state of the electronic switch; and
a scan controller configured to control the RF transmitter and RF receiver and the control circuit.

18. The magnetic resonance system according to claim 17, further including:
a data processor which processes resonance data from the RF receiver to produce one of a magnetic resonance imaging data or magnetic resonance spectroscopy data; and
a display which displays results of the resonance signal processing.

19. A magnetic resonance method, including:
transmitting RF excitation signals at a magnetic resonance (MR) frequency to induce resonance signals in an examination region;
with-the electronic switch according to claim 11, tuning the RF receive coil to an MR frequency to receive resonance signals from the examination region and detuning the RF receive coil to inhibit the RF receive coil from receiving the transmitted RF excitation signal.

20. The method according to claim 19, wherein the FETs of the array are fabricated from at least one of silicon-carbide FETs or gallium-nitride FETs.

* * * * *